US009425389B2

(12) United States Patent
Wang

(10) Patent No.: US 9,425,389 B2
(45) Date of Patent: Aug. 23, 2016

(54) DOPED TERNARY NITRIDE EMBEDDED RESISTORS FOR RESISTIVE RANDOM ACCESS MEMORY CELLS

(71) Applicant: Intermolecular Inc., San Jose, CA (US)

(72) Inventor: Yun Wang, San Jose, CA (US)

(73) Assignee: Intermolecular, Inc., San Jose, CA (US)

(*) Notice: Subject to any disclaimer, the term of this patent is extended or adjusted under 35 U.S.C. 154(b) by 0 days.

(21) Appl. No.: 14/562,971

(22) Filed: Dec. 8, 2014

(65) Prior Publication Data

US 2016/0163977 A1 Jun. 9, 2016

(51) Int. Cl.
*H01L 45/00* (2006.01)
*H01L 27/24* (2006.01)

(52) U.S. Cl.
CPC .......... *H01L 45/1233* (2013.01); *H01L 45/08* (2013.01); *H01L 45/12* (2013.01); *H01L 45/1608* (2013.01)

(58) Field of Classification Search
CPC .......... H01L 45/1633; H01L 45/1675; H01L 45/146
See application file for complete search history.

(56) References Cited

U.S. PATENT DOCUMENTS

| 2003/0151116 | A1 | 8/2003 | Cabral, Jr. et al. | |
| 2009/0184307 | A1* | 7/2009 | Yoon | H01L 45/06 257/3 |
| 2010/0065804 | A1* | 3/2010 | Park | H01L 27/2409 257/4 |
| 2013/0126510 | A1* | 5/2013 | Oh | H01L 27/0296 219/209 |
| 2013/0235646 | A1 | 9/2013 | Nojiri | |

OTHER PUBLICATIONS

CK Chung et al; Effect of SiTa and Nitrogen Ratios on the Thermal Stability of TaSiN Thin Films ; ; Elsevier Sequoia; Unknown.

* cited by examiner

*Primary Examiner* — Raj R Gupta

(57) ABSTRACT

Provided are resistive random access memory (ReRAM) cells with embedded resistors and methods of fabricating these cells. An embedded resistor may include a metal silicon nitride of a first metal and may be doped with a second metal, which is different from the first metal. The second metal may have less affinity to form covalent bonds with nitrogen than the first metal. As such, the second metal may be unbound and more mobile in the embedded resistor that the first metal. The second metal may help establishing conductive paths in the embedded resistor in addition to the metal nitride resulting in more a stable resistivity despite changing potential applies to the ReRAM cell. In other words, the embedded resistor having such composition will have more linear I-V performance. The concentration of the second metal in the embedded resistor may be substantially less than the concentration of the first metal.

11 Claims, 7 Drawing Sheets

Initial Forming

Operational Switching

DOPED TERNARY NITRIDE EMBEDDED RESISTORS FOR RESISTIVE RANDOM ACCESS MEMORY CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells with embedded resistors and methods of fabricating these cells. An embedded resistor may include a metal silicon nitride of a first metal and may be doped with a second metal, which is different from the first metal. The second metal may have less affinity to form covalent bonds with nitrogen than the first metal. As such, the second metal may be unbound and more mobile in the embedded resistor that the first metal. The second metal may help establishing conductive paths in the embedded resistor in addition to the metal nitride resulting in more a stable resistivity despite changing potential applies to the ReRAM cell. In other words, the embedded resistor having such composition will have more linear I-V performance. The concentration of the second metal in the embedded resistor may be substantially less than the concentration of the first metal.

In some embodiments, a memory cell a first layer operable as an electrode, a second layer operable to reversibly switch between two stable resistive states in response to applying a switching signal to the memory cell, a third layer operable to maintain a constant resistance when the switching signal is applied to the memory cell, and a fourth layer operable as an electrode. The second layer is disposed between the first layer and the fourth layer. The third layer may be disposed between the first layer and the fourth layer. The third layer includes a metal silicon nitride of a first metal. The third layer is doped with a second metal. The second metal is different from the first metal of the metal silicon nitride. For example, the first metal has a higher affinity to form a covalent bond with nitrogen than the second metal.

In some embodiments, the concentration of the second metal in the third layer is lower than the concentration of the first metal in the third layer. For example, the concentration of the second metal in the third layer is less than 5 atomic percent. The concentration of the first metal in the third layer is at least 20 atomic percent. In some embodiments, a concentration of the second metal in the third layer gradually increases from one side to another side throughout the thickness of the third layer. For example, the concentration at the side of the third layer facing the first layer may be different from the concentration at the side facing the fourth layer. Alternatively, the concentration of the second metal in the third layer is uniform throughout the third layer.

In some embodiments, the first metal is one of tantalum, titanium, tungsten, or molybdenum. The second metal may be one of yttrium, nickel, copper, cobalt, chromium, zirconium, hafnium, or lanthanum. Specifically, the first metal may be tantalum, while the second metal may be nickel. In some embodiments, the second metal may be substantially unbound to nitrogen in the third layer. The second metal is present in an oxidized state in the third layer.

Also provided is a method of fabricating a memory cell. The method may involve forming a first layer over a substrate, forming a second layer over the first layer, forming a third layer over the second layer, and forming a fourth layer operable as an electrode over the third layer. The first layer is operable as an electrode. The second layer is operable to reversibly switch between two stable resistive states in response to applying a switching signal to the memory cell. The third layer is operable to maintain a constant resistance when the switching signal is applied to the memory cell. The third layer includes a metal silicon nitride of a first metal. The third layer is doped with a second metal such that the second metal being different from the first metal of the metal silicon nitride.

In some embodiments, forming the third layer over the second layer involves forming an initial layer including the metal silicon nitride and then doping the initial layer with the second metal. Doping the initial layer with the second metal may involve one of ion-implantation or thermal diffusion. Forming the third layer over the second layer may involve co-sputtering two targets, e.g., a first target having the first metal and a second target having the second metal.

In some embodiments, forming the third layer over the second layer involves atomic layer deposition of one of more layers including the first metal. Forming the third layer over the second layer may involve atomic layer deposition of one or more layers including the second metal. In some embodiments, the method also involves annealing the third layer to uniformly distribute the second metal within the third layer.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
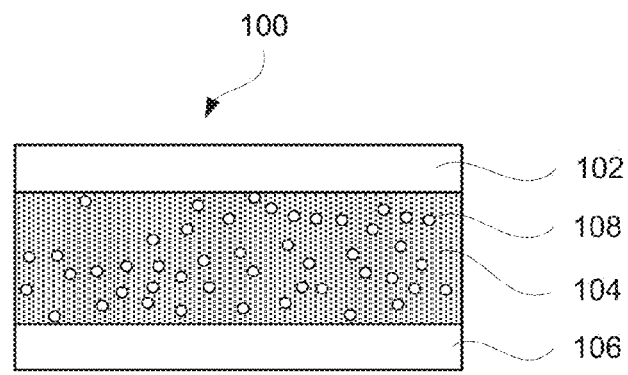
FIG. 1A illustrates a schematic representation of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided in between the two electrodes and identified as "I". The insulator layer changes its resistive properties when certain switching voltages are applied to the layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching voltages may be applied as series of pulses and may be generally referred to as switching voltage profiles or, more specifically, set voltage profiles and reset voltage profiles. For example, a switching voltage pulse may be used to change ("set" or "reset") the resistive state followed by a smaller reading voltage pulse to determine the current state of the ReRAM cell at that time. Unlike the switching voltage pulse, the reading pulse is specifically configured to avoid changing the resistive state of the ReRAM cell and is configured only to determine the current state. The switching pulse may be repeated until the desired resistive state is reached. The switching pulses may alternate with the reading pulses for feedback control. The switching pulses may vary from one to another based on their potential (e.g., a gradual increase in the potential), duration, and other characteristics. The reading pulses may be the same. The process of applying the switching pulses and reading pulses may continue until the desired resistive state is reached.

The change in resistance of the resistive switching layer is a dynamic process that needs to be well controlled to prevent over-programming. For example, when the resistive switching layer is switched from its high resistive state (HRS) to its low resistive state (LRS), a rapid drop in resistance associated with this switch may cause an excessive current through the resistive switching layer and an over-programming. The over-programming occurs when change in the resistance continues even after the resistive switching layer reaches its desirable resistance. One approach to prevent over-programming is by using very short pulses, e.g., about 50 nanoseconds, followed by a reading pulse. If the desired resistive state is not reached, another pulse is applied. The process of applying switching and reading pulses may be repeated until the desired resistance is reached. However, shorter pulses have their own inherent limitations, such as requiring more pulses or higher voltages to achieve the same switching result, which may consume more power than fewer, longer, lower-voltage pulses. Furthermore, even during a relatively short switching pulse, the change in resistance may be sufficiently large to result in current spiking and over-programming. In some embodiments, the difference in resistances between the LRS and the HRS may be more than an order of magnitude to allow the read pulses to easily differentiate between the two states.

To prevent current spiking and over-programming, an embedded resistor is connected in series with the resistive switching layer and is used to limit the current through the resistive switching layer. Specifically, an embedded resistor is a layer operable to maintain a constant resistance when the switching signal is applied to the ReRAM cell. The embedded resistor effectively functions as a voltage divider within the ReRAM cell. Unlike the resistive switching layer, the embedded resistor maintains a constant resistance throughout the entire operation of the cell. As a relative change of the overall ReRAM cell resistance (expressed as a ratio of the change in the resistance of the ReRAM cell to the overall initial resistance) when the resistive switching layer goes between the LRS and the HRS is less for ReRAM cells with embedded resistors than for similar cells without embedded resistor. This voltage dividing/constant resistance characteristic of the embedded resistor helps to prevent the current spiking and over-programming.

In some embodiments, two modes of integrating an embedded resistor into the ReRAM cell (e.g., a direct mode and a remote mode) may be used. The direct mode may involve an embedded resistor used as an electrode or positioned between an electrode and resistive switching layer. The embedded resistor may directly interface with the resistive switching layer. Such position of the embedded resistor may reduce the number of layers needed in the memory cell. Fewer layers may result in a smaller overall thickness of the memory cell in comparison to the cell with a larger number of layers. Furthermore, fewer layers are simpler to process and integrate that a larger number of layers. However, forming a controlled interface with the resistive switching layer may be difficult with this approach. The other mode, i.e., the remote mode, may involve disposing the embedded resistor on the other side of the electrode relative to the resistive switching layer. In other words, the electrode is disposed between the embedded resistor and resistive switching layer. In this case, the electrode may directly interface with the resistive switching layer and be used to control the interface. Without being restricted to any particularly theory, one of the interfaces of the resistive switching layer may be responsible for resistive switching. This interface may be referred to as a switching interface, while the other interface may be referred to as an inert interface. The switching interface may have a greater mobility of various materials through the interface than the inert interface. For example, if a resistive switching layer includes an oxide, an electrode forming a switching interface with this resistive switching layer may be formed from a material capable of receiving and releasing oxygen.

Ternary metal silicon nitrides, which may be represented by MeSiN where Me is one of tantalum (Ta), titanium (Ti), tungsten (W), or molybdenum (Mo), are promising material candidates for the embedded resistor. However, many ternary metal silicon nitrides tend to form metal nitride (MeN) clusters in the silicon nitride (SiN) environment due to the phase separation of the ternary metal silicon nitrides into metal nitride and silicon nitride as established by phase diagrams of the respective materials. When the metal nitride clusters are formed, the electronic current conduction path is dominated by tunneling transmission through those clusters. As a result, the embedded resistor formed from a ternary metal silicon nitride may behave in a non-linear fashion. Specifically, the resistance of such an embedded resistor may depend on the nature of the tunneling transmission and voltage variation causing the non-linear behavior and changes in the resistance. The non-linear behavior of the embedded resistor is not desirable because the resistor is relied on as a voltage divider during various critical operations of the memory cell, and this behavior may cause unwanted resistance or voltage drop during forming process, in particular when high voltages are applied to the cell in order to lower the resistance of the resistive switching layer.

It has been found that adding certain dopants into ternary metal silicon nitrides may significantly stabilize the resistance thereby achieving a more linear behavior of embedded resistor formed from such materials. For differentiating reasons, an element that forms a nitride and that is presented in a higher concentration than a dopant may be referred to as a "first" element or, in case of metals, a "first" metal. The dopant may be referred to as a "second" element or, in case of metals, a "second" metal. For example, one of second metals (e.g., yttrium, nickel, copper, cobalt, chromium, zirconium, hafnium, or lanthanum) may be doped in a ternary metal silicon nitride that is formed from one of first metals (e.g., tantalum, titanium, tungsten, or molybdenum), which may form one of $Ta_xSi_yN$, $Ti_xSi_yN$, $W_xSi_yN$, and $Mo_xSi_yN$. The second element may be selected such that its ability to bind with nitrogen is less than that of the first element. In some embodiments, some of the second element may be bound to silicon and/or nitrogen and may be referred to as $Me1_xMe_ySi_zN$ compound. In some embodiment, no covalent bonding may be formed between the second element and nitrogen, while the first element is covalently bound to nitrogen. As a result, the unbound second element may remain mobile and fill in the gaps between nitride clusters formed by the first element. In this case, the conduction may be achieved by a combination of the nitride clusters of the first element and by the second element. The additional conduction provided by the second element helps to minimize tunneling effect and resistance variations with the changing voltage. It has been found that this combination of the nitride clusters of the first element and by the second element has a more linear behavior than the corresponding un-doped ternary metal silicon nitride. In addition to using various metals as dopants (e.g., some examples of such metals are listed above), various other non-metal elements can be used as dopants. For example, silicon or nitrogen in a ternary metal silicon nitride may be partially or completely replaced by boron, phosphorous, fluorine, chlorine, tellurium, or sulfur. Metal dopants may help with suppressing formation of tantalum nitride clusters when, for example, TaSiN i used. Furthermore, metal dopants may provide conductive paths that replace and bypass conductive clusters, such as tantalum nitride clusters. Non-metal dopants can be used at concentrations greater than $10^{17}$ atoms/cm$^3$ to achieve desired conductivities, for example. Metal dopants could be deposited using PVD or ALD, while non-metal dopants may be added using diffusion furnace or implantation techniques.

The I-V performance of a doped ternary metal silicon nitride can be adjusted by distribution of the dopant with an embedded resistor formed by the doped ternary metal silicon nitride. For example, a dopant concentration may be uniform throughout the entire embedded resistor. Alternatively, the embedded resistor can have the dopant concentration gradually changing throughout the thickness of the embedded resistor, e.g., from a side directly interfacing the resistive switching layer to the opposite side of the embedded resistor. Concentrations may have stepped profiles, gradual profiles, and other like variations. The dopant could be added during deposition of the ternary metal silicon nitride. For example, co-sputter the dopant during the PVD deposition or nano-laminate the dopant using alternating cycles in ALD deposition. It could also be achieved by ion-implantation or thermal diffusion in a furnace, and other like methods further described below.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistive switching layer 104 which may be initially formed from a dielectric material and later can be made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
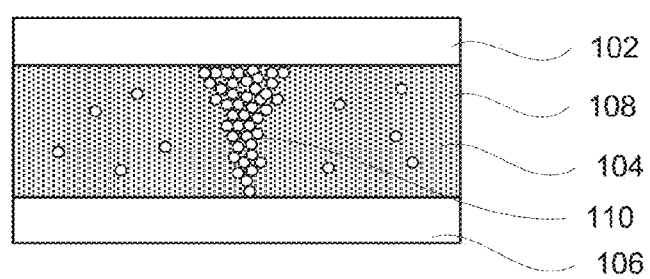
FIGS. 1B and 1C illustrate schematic representations of the ReRAM cell in its high resistive state (HRS) and low resistive state (LRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B. Furthermore, some or all defects 108 forming the conductive paths may enter resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
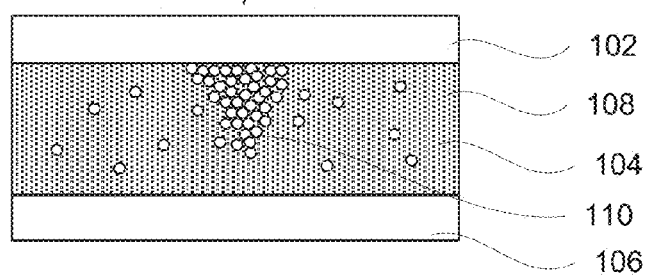

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
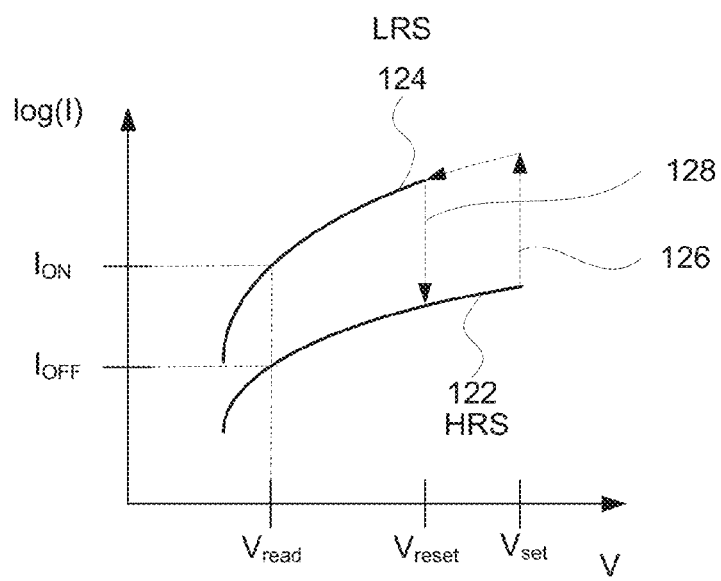
FIG. 2A illustrates a plot of a current passing through a unipolar ReRAM cell as a function of a voltage applied to the ReRAM cell, in accordance with some embodiments.
Figure 2B:
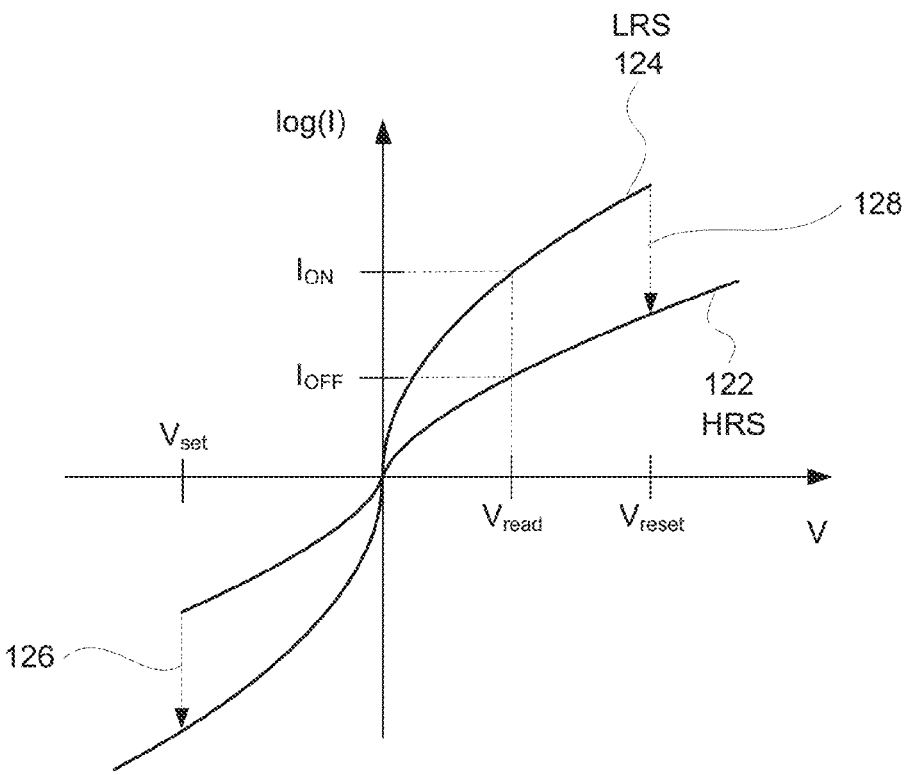
FIG. 2B illustrates a plot of a current passing through a bipolar ReRAM cell as a function of a voltage applied to the ReRAM cell, in accordance with some embodiments.

Specifically, FIG. 2A illustrates a plot of a log current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20 Å of oxide thickness in HRS.

Examples of ReRAM Cells

Figure 3A:
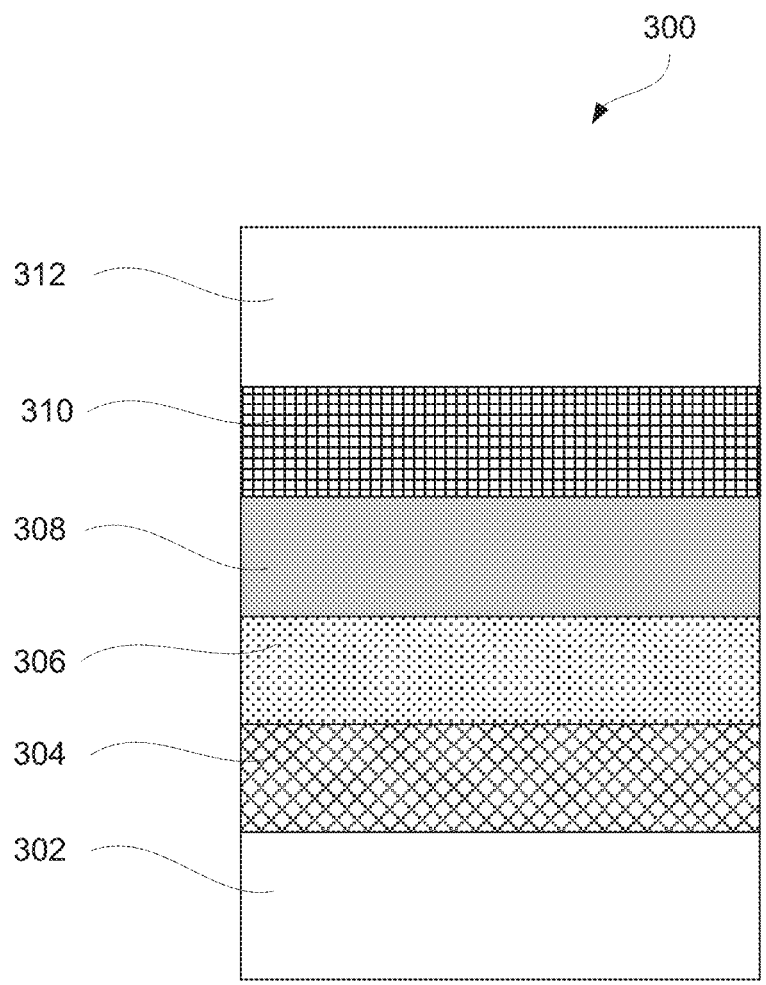
FIG. 3A illustrates a schematic representation of a ReRAM cell including an embedded resistor, resistive switching layer, and other components, in accordance with some embodiments.

FIG. 3A illustrates a schematic representation of a ReRAM cell 300, in accordance with some embodiments. ReRAM cell 300 may include a first signal line 302, a current steering element 304, a resistive switching layer 306, an embedded resistor 308, an intermediate electrode 310, and a second signal line 312. The "first" and "second" terminology is used herein only for differentiating reasons and does not imply any deposition order or spatial orientation of the layers unless specifically noted. In some embodiments, ReRAM cell 300 has more or fewer layers. For example, an intermediate layer may be disposed between electrode 310 and embedded resistor 308 in order to improve electrical connection between electrode 310 and embedded resistor 308. Furthermore, current steering element 304 and/or intermediate electrode 310 may be omitted from ReRAM cell 300. In some embodiments, embedded resistor 308 may directly interface resistive switching layer 306.

In the example illustrated in FIG. 3A, a portion of current steering element 304 is also operable as another intermediate electrode interfacing resistive switching layer 306. Likewise, when intermediate electrode 310 is not present, a portion of embedded resistor 308 may be operable as an intermediate electrode. In some embodiments, resistive switching layer 306 is positioned in between and directly interfaces two designated electrodes. In some embodiments, the electrodes may be sufficiently conductive and may be used as signal lines. Alternatively, signal lines and electrodes may be separate components as, for example, illustrated in FIG. 3A. First signal line 302 and second signal line 312 provide electrical connections to ReRAM cell 300. For example, first signal line 302 and/or second signal line 312 extend between multiple ReRAM cells, which may be cells provided in the same row or the same column of a memory array as further described below with reference to FIGS. 5A and 5B. First signal line 302 and second signal line 312 may be made from conductive materials, such as n-doped polysilicon, p-doped polysilicon, titanium nitride, ruthenium, iridium, platinum, and tantalum nitride. The signal lines may have a thickness of less than about 100 nanometers (nm), such as less than about 50 nm and even less than about 10 nm. Thinner electrodes may be formed using atomic layer deposition (ALD) techniques.

Current steering element 304, if one is present, may be an intervening electrical component, such as a p-n junction diode, p-i-n diode, transistor, or other similar device disposed between first signal line 302 and second signal line 312. As such, current steering element 304 is connected in series with resistive switching layer 306. In some embodiments, current steering element 304 may include two or more layers of semiconductor materials, such as two or more doped silicon layers, that are configured to direct the flow of current through the device. Current steering element 304 may be a diode that includes a p-doped silicon layer, an un-doped intrinsic layer, and an n-doped silicon layer. These layers are not specifically identified in FIG. 3A. The overall resistance of current steering element 304 may be between about 1 kilo-Ohm and about 100 Mega-Ohm. The overall resistance generally depends on the type of current steering element 304 and direction of the current flow through current steering element 304 (e.g., forward or reversed biased). In some embodiments, current steering element 304 may include one or more nitrides. For example, current steering element 304 may be a layer of titanium nitride.

Resistive switching layer 306 can be fabricated from a dielectric material, such as a metal oxide material or other similar material that can be switched between two or more stable resistive states. In some embodiments, resistive switching layer 306 is fabricated from a silicon oxide. Accordingly, resistive switching layer 306 may be a layer of $SiO_2$ that is formed on and directly interfaces current steering element 304. Moreover, resistive switching layer 306 may have a thickness of between about 1 nm to about 100 nm, such as between about 2 nm and 20 nm or, more specifically, between about 5 nm and 10 nm. For example, resistive switching layer 306 may have a thickness of about 10 nm. Thinner resistive switching layers may be deposited using ALD, while thicker resistive switching layers may be deposited using may be deposited using ALD or physical vapor deposition (PVD) or, in some embodiments, chemical vapor deposition (CVD).

Figure 3B:
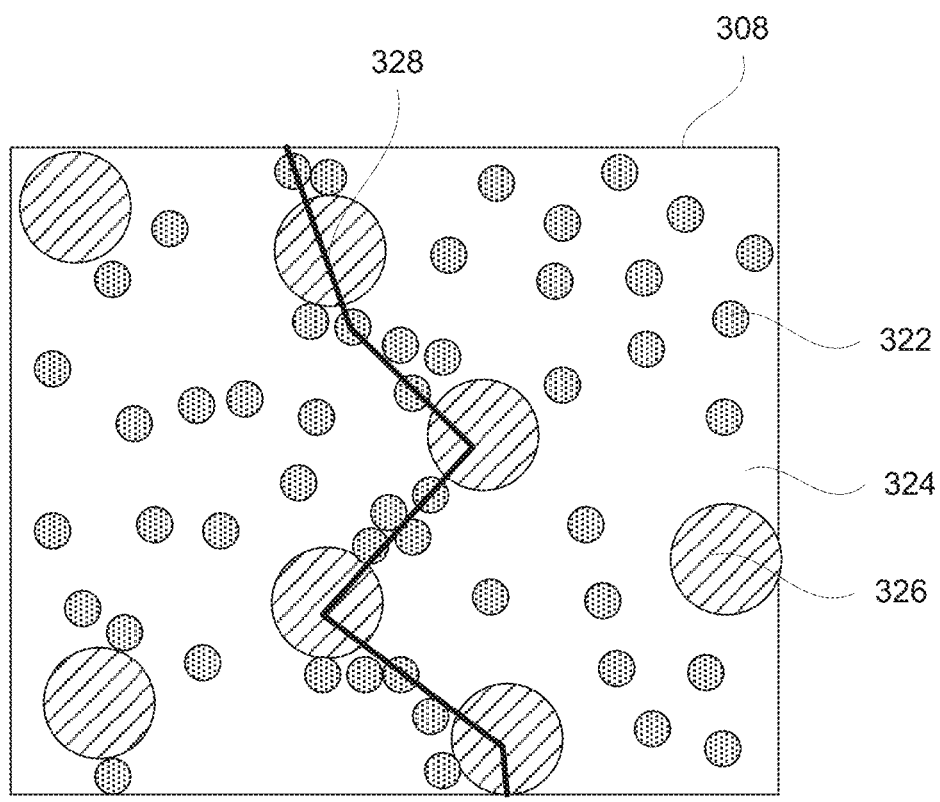
FIG. 3B illustrates a schematic representation of an embedded resistor during formation of a conductive path, in accordance with some embodiments.

Embedded resistor 308 may be disposed between electrode 310 and resistive switching layer 306. Embedded resistor 308 includes a metal silicon nitride of a first metal and is doped with a second metal. The second metal is different from the first metal of the metal silicon nitride. Specifically, the first metal has a higher affinity to form a covalent bond with nitrogen than the second metal. For purposes of this disclosure, a high affinity is defined based on Gibb's free energy of forming a nitride. For example, the Gibb's free energy of nitride formation is more negative (i.e., more favored) for the first metal than for the second metal For example, the first metal may form covalent bonds with nitrogen, while the second metal may not form such bonds. FIG. 3B is a schematic representation of a cross-section of embedded resistor 308, in accordance with some embodiments. Second metal clusters 322 is schematically shown with smaller circles, while first metal nitride clusters 326 formed from phase separation of the metal silicon nitride are schematically shown with larger circles. Silicon nitride environment, which is also formed from the phase separation of the metal silicon nitride, is identified with numeral 324. When a voltage is applied to embedded resistor 308, second metal clusters 322 and first metal nitride clusters 326 form one or more conductive paths, one of which is schematically shown with numeral 328. Second metal clusters 322 are more mobile than first metal nitride clusters 326 because the second metal is not bound to nitrogen. Second metal clusters 322 may fill the gaps between first metal nitride clusters 326 and the tunneling effect of first metal nitride clusters 326 is reduced.

In some embodiments, the concentration of the second metal in embedded resistor 308 is lower than the concentration of the first metal in embedded resistor 308. For example, the concentration of the second metal may be less than about 5 atomic percent or even less than about 2 atomic percent or even less than about 1 atomic percent. At this concentration, the second metal may still fill the gaps between the nitride clusters without dominating the conductivity of embedded resistor 308. At higher concentrations, the conductivity of embedded resistor may be too high requiring a thicker resistor to achieve the same overall resistance, which may be undesirable from the scalability perspective. The concentration of the first metal in embedded resistor 308 may be at least about 20 atomic percent or even at least about 30 atomic percent.

Figure 3C:
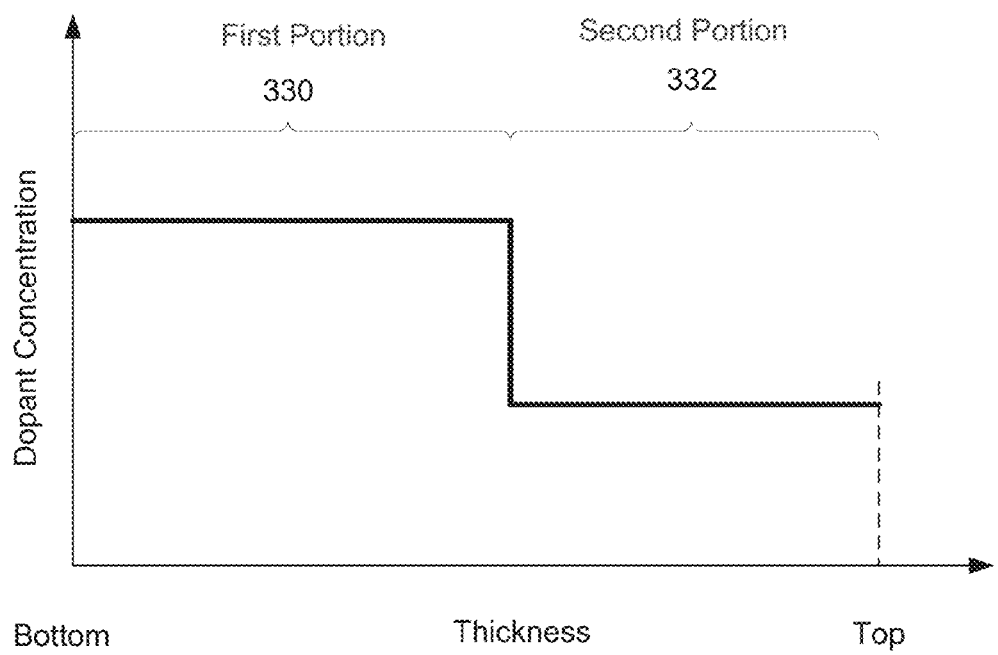
FIGS. 3C and 3D illustrate schematic plots of dopant concentration profiles in embedded resistors, in accordance with some embodiments.
Figure 3D:
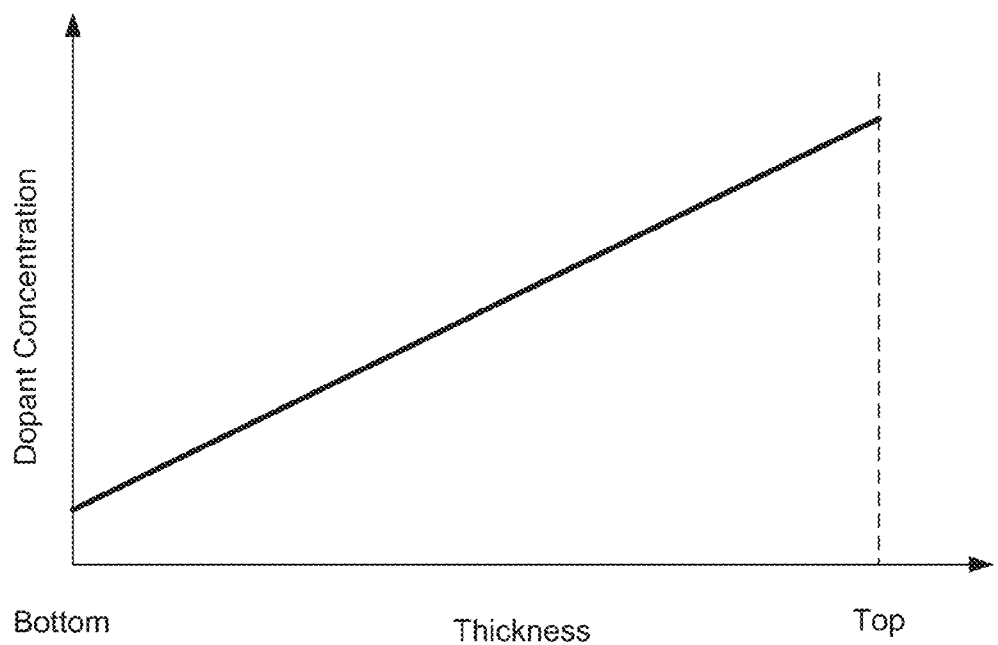

The I-V performance of the doped ternary metal silicon nitride may be adjusted by varying concentrations of the second metal, i.e., the dopant, within embedded resistor 308. A couple of such examples are presented in FIGS. 3C and 3D. Specifically, FIG. 3C is a schematic illustration of a concentration of the second metal in embedded resistor 308 that has a stepwise or line-segment distribution. Specifically, embedded resistor 308 has two portions having different composition. Each portion has a uniform distribution of the second metal within this portion. However, the concentration of the second metal in one portion (e.g., portion 330 in FIG. 3C) may be higher than the concentration of the second metal in the other portion (e.g., portion 332 in FIG. 3C). While only two portions are show in this example, one having ordinary skills in the art would understand that any number of portions having stepwise or line-segment distribution of the second metal may be used. A higher dopant concentration portion may be at the side facing away from the resistive switching layer to prevent diffusion of dopants into the resistive switching layer. FIG. 3D illustrates an example of embedded resistor 308 having a concentration of the second metal gradually increasing from one side to another side of embedded resistor 308. Furthermore, the concentration of the second metal in embedded resistor 308 may be uniform throughout embedded resistor. In some embodiments, two or more of stepwise increase distribution, gradual increase distribution, and uniform distribution may be combined in the same embedded resistor 308. For example, a portion of embedded resistor 308 may have one of these distribution profiles, while another portion may have another one of these distribution profiles.

Some examples of the first metal include tantalum, titanium, tungsten, and molybdenum. Some examples of the second metal include yttrium, nickel, copper, cobalt, chromium, zirconium, hafnium, are lanthanum. Specific combinations of these two types of metals in the same embedded resistor 308 are as follows. In one example, the first metal may be tantalum, while the second metal may be nickel. Another example is a combination of cobalt and yttrium. Boron, phosphor, and arsenic may be used as dopants in these examples. In some embodiments, the second metal may be substantially unbound to nitrogen in embedded resistor 308. The second metal may be present in an oxidized state, which enhances mobility of the second metal within embedded resistor 308 when a potential is applied to the embedded resistor 308.

In some embodiments, embedded resistor 308 has a thickness of between about 5 nm and 10 nm. More specifically, embedded resistor 308 may have a thickness of between about 3 nm and 8 nm. In one example, a footprint (i.e., cross-sectional area) of embedded resistor 308 may be between about 20 nanometers-square and 100 nanometers-square or, more specifically, between about 30 nanometers-square and 60 nanometers-square, such as about 60 nanometers-square. It will be appreciated that a size or diameter of ReRAM cell 300 and embedded resistor 308 may be determined or configured to achieve a particular target resistance which may be, for example, 100 KOhms. Moreover, a thickness and composition of embedded resistor 308 may also be adjusted for a particular size or diameter to also achieve the target resistance. In this way, a size, thickness, and composition of embedded resistor 308 may each be configured to achieve a particular target resistance which may be determined based on a desired resistance at a particular switching voltage and current.

Electrode 310 may be fabricated from a conductive material that has a desirable conductivity and work function, such as p-type polysilicon, n-type polysilicon, transition metals, transition metal alloys, transition metal nitrides, or transition metal carbides. For example, electrode 310 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 310 may include titanium/aluminum alloy and/or a silicon-doped aluminum. In some embodiments, electrode 310 may be formed from titanium, tantalum, or aluminum. Electrode 310 may be between about 5 nm and about 500 nm thick or, more specifically, between about 10 nm and about 100 nm thick.

Processing Examples

Figure 4:
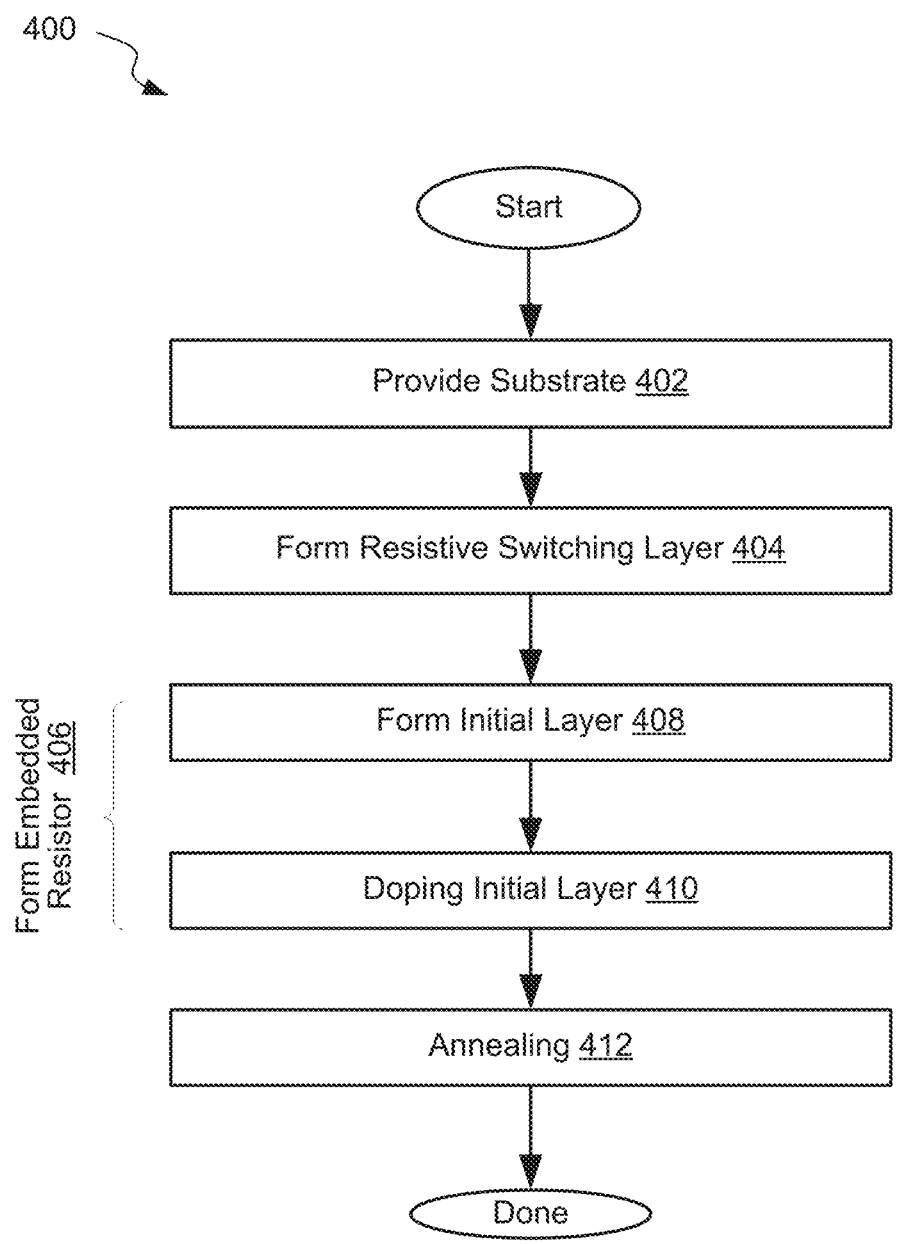
FIG. 4 illustrates a process flowchart corresponding to a method of fabricating a ReRAM cell including an embedded resistor, in accordance with some embodiments.

FIG. 4 illustrates a process flowchart corresponding to method 400 of fabricating a ReRAM cell, in accordance with some embodiments. Method 400 may commence with providing a substrate during operation 402. The substrate may include one or more components, such as a first signal line, a first electrode, and a current steering element. In other embodiments, method 400 involves forming the first signal line, the first electrode, and/or, for example, the current steering element on the substrate. The signal line can be made of silicon (e.g., doped polysilicon), a silicide, titanium nitride, or other appropriate materials listed elsewhere in this document. For example, a titanium nitride layer may be formed using PVD or other suitable deposition techniques. Deposition of the titanium nitride layer may be performed using a titanium target in a nitrogen atmosphere maintained at a pressure of between about 1-20 milliTorr. A deposition rate of about 0.05 nm per second may be used. These process parameters are provided as examples and generally depend on deposited materials, tools, deposition rates, and other factors. Other processing techniques, such as ALD, PLD, CVD, evaporation, and the like can also be used to deposit the first signal line and, in some embodiments, the current steering element.

Method 400 may proceed with forming a resistive switching layer during operation 404. The resistive switching layer may be formed directly over the substrate or current steering element, if one is included. Thus, the resistive switching layer may directly interface the current steering element. The resistive switching layer may include a material, such as silicon oxide, hafnium oxide, zirconium oxide, or other suitable materials. The thickness of the resistive switching layer may be at between about 5 Angstroms and 100 Angstroms or, more specifically, between about 10 Angstroms and 50 Angstroms. Any suitable deposition technique may be used to form the resistive switching layer, such as an atomic layer deposition (ALD) process or a physical vapor deposition (PVD) process. For example, hafnium oxide may be deposited using a PVD target including hafnium. Sputtering may be performed in an oxygen-containing atmosphere. In this example, the composition of the embedded resistor depends on a concentration of oxygen in the sputtering environment as well as relative amounts of hafnium in the sputtering target. For example, a hafnium oxide layer having a thickness of between about 5-10 nm may be formed using reactive sputtering by employing a metal hafnium target in a 20-60% oxygen atmosphere. These process parameters are provided as examples and generally depend on deposited materials, tools, deposition rates, and other factors. In another example, a PVD process may be used to deposit a layer of hafnium and a plasma containing environment may be used to oxide the deposited layer.

Method 400 may proceed with forming an embedded resistor during operation 406. Various examples of embedded resistors are described above with reference to FIG. 3A. Specifically, the embedded resistor formed during operation 406 includes a metal silicon nitride of a first metal. The embedded resistor is also doped with a second metal such that the second metal being different from the first metal of the metal silicon nitride.

Operation 406 may have multiple sub-operations as, for example, shown in FIG. 4. For example, operation 406 may involve forming an initial layer during sub-operation 408. The initial layer may include the metal silicon nitride of the first metal but not the second metal. The metal silicon nitride layer may be formed by sputtering a target including the second metal and silicon. In some embodiments, the second metal is provided in one target, while silicon is provided in another target. The two targets may be sputtered at the same time. Regardless of the number of targets, sputtering may be performed in a nitrogen containing environment thereby causing reactive sputtering. Other suitable techniques for depositing the metal silicon nitride of the first metal include chemical vapor deposition (CVD) and ALD.

Operation 406 may then proceed with sub-operation 410, during which the initial layer (formed during sub-operation 408) is doped with the second metal. Doping may involve one of ion-implantation or thermal diffusion. Ion implantation accelerates the dopant elements (e.g., the second metal) in an electric field and forcefully adds dopant elements into the metal silicon nitride in the form of energetic ion beam injection. Thermal diffusion energizes the dopant elements (e.g., the second metal) thermally in a furnace and moves dopant elements into the metal silicon nitride via substitutional or interstitial diffusion mechanisms.

In some embodiments, forming the embedded resistor may be performed in a single step such as co-sputtering two targets, e.g., a first target having the first metal and a second target having the second metal. As such, a subsequent dopant operation is not needed to introduce the second metal. The second metal is being introduced while the metal silicon nitride of the first metal is formed. In another example, forming the embedded resistor may involve ALD of one of more layers including the first metal and then one or more layers including the second metal. One or more layers including silicon may be also formed by ALD. Distribution of these layers may be design to achieve concentration profiles of the second metal and other components in the embedded resistor, as described above with reference to FIGS. 3C and 3D.

Method 400 may proceed with annealing operation 412. Annealing may be used to more uniformly redistribute components (e.g., the second metal) within the embedded resistor. In some embodiments, annealing may be performed at a temperature of between about 500° C. and 900° C., such as around 750° C. This annealing may be a part of another operation, such as activation of diodes used for addressing cells in a memory array.

Memory Array Examples

Figure 5A:
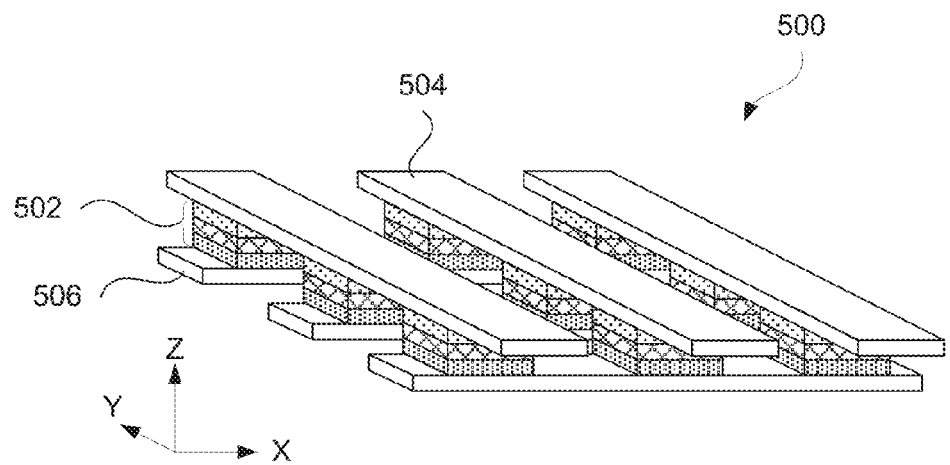
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as first and second electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 504 and 506.

As stated above, various read and write controllers may be used to control operations of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
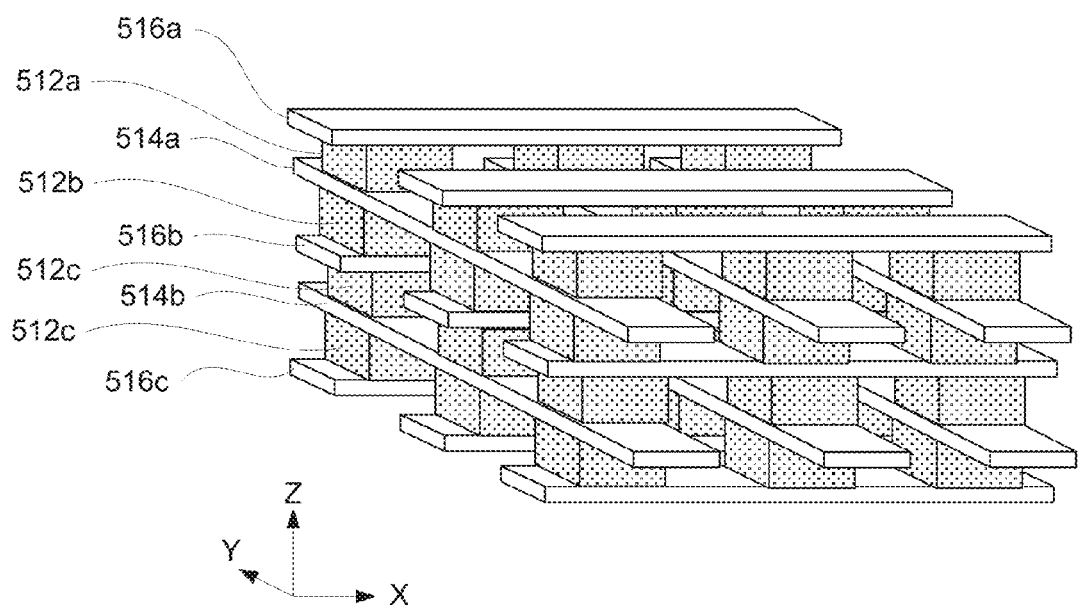

In some embodiments, a memory device may include multiple array layers as, for example, illustrated in FIG. 5B. In this example, five sets of signal lines 514a-b and 516a-c are shared by four ReRAM arrays 512a-c. As with the previous example, each ReRAM array is supported by two sets of signal lines, e.g., array 512a is supported by 514a and 516a. However, middle signal lines 514a-b and 516b, each is shared by two sets ReRAM arrays. For example, signal line set 514a provides connections to arrays 512a and 512b. First and second sets of signal lines 516a and 516c are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A memory cell comprising:
a first layer operable as an electrode;
a second layer operable to reversibly switch between two stable resistive states in response to applying a switching signal to the memory cell;
a third layer operable to maintain a constant resistance when the switching signal is applied to the memory cell; and
a fourth layer operable as an electrode;
wherein the second layer is disposed between the first layer and the fourth layer;
wherein the third layer comprises a metal silicon nitride of a first metal; and
wherein the third layer is doped with a second metal, the second metal being different from the first metal of the metal silicon nitride; and
wherein a concentration of the second metal in the third layer gradually increases from one side to another side of the third layer throughout a thickness of the third layer.

2. The memory cell of claim 1, wherein the first metal has a higher affinity to form a covalent bond with nitrogen than the second metal.

3. The memory cell of claim 1, wherein a concentration of the second metal in the third layer is lower than a concentration of the first metal in the third layer.

4. The memory cell of claim 3, wherein the concentration of the second metal in the third layer is less than 5 atomic percent.

5. The memory cell of claim 4, wherein the concentration of the first metal in the third layer is at least 20 atomic percent.

6. The memory cell of claim 1, wherein the first metal is one of tantalum, titanium, tungsten, or molybdenum.

7. The memory cell of claim 1, wherein the second metal is one of yttrium, nickel, copper, cobalt, chromium, zirconium, hafnium, or lanthanum.

8. The memory cell of claim 1, wherein the first metal is tantalum, and wherein the second metal is nickel.

9. The memory cell of claim 1, wherein the second metal is substantially unbound to nitrogen in the third layer.

10. The memory cell of claim 1, wherein the second metal is present in an oxidized state in the third layer.

11. The memory cell of claim 1, wherein the third layer is disposed between the first layer and the fourth layer.

* * * * *